United States Patent [19]
Partlo et al.

[11] Patent Number: 5,914,974
[45] Date of Patent: Jun. 22, 1999

[54] METHOD AND APPARATUS FOR ELIMINATING REFLECTED ENERGY DUE TO STAGE MISMATCH IN NONLINEAR MAGNETIC COMPRESSION MODULES

[75] Inventors: William N. Partlo, San Diego; Richard L. Sandstrom, Encinitas; Daniel L. Birx, Oakley; Richard Mons Ness, San Diego, all of Calif.

[73] Assignee: Cymer, Inc., San Diego, Calif.

[21] Appl. No.: 08/803,890

[22] Filed: Feb. 21, 1997

[51] Int. Cl.$^6$ ..................................................... H01S 3/00
[52] U.S. Cl. ............................................ 372/38; 307/108
[58] Field of Search ....................... 372/38, 25; 307/106, 307/108

[56] References Cited

U.S. PATENT DOCUMENTS

| | | |
|---|---|---|
| 3,806,829 | 4/1974 | Duston et al. . |
| 3,849,670 | 11/1974 | Lourigan . |
| 4,549,091 | 10/1985 | Fahlen et al. ............................ 307/106 |
| 4,674,022 | 6/1987 | Ver Planck . |
| 4,803,378 | 2/1989 | Richardson . |
| 4,975,924 | 12/1990 | Iwata et al. . |
| 5,066,928 | 11/1991 | Ikezi et al. . |
| 5,072,191 | 12/1991 | Nakajima et al. . |
| 5,124,629 | 6/1992 | Ball et al. . |
| 5,138,193 | 8/1992 | Bruno et al. . |

(List continued on next page.)

FOREIGN PATENT DOCUMENTS

| | | |
|---|---|---|
| 2204728 | 5/1987 | United Kingdom . |
| WO 89/10657 | 11/1989 | WIPO . |
| WO 93/00743 | 1/1993 | WIPO . |

OTHER PUBLICATIONS

Birx et al., "Magnetic Compressors: High–Power Pulse Sources," *Energy and Technology Review*, Aug. 1983.

Schedule of Proceedings of the 1995 SPIE International Symposium on "Microlithography," Santa Clara, California p. 15 [2440–06] Feb. 19–24, 1995. No Month.

Komat'su Sales Brochure, "KLES–G7 Solid State Pulsed Power KrF Excimer Laser," Jul. 1, 1995.

Birx et al, "Basic Principles Governing the Design of Magnetic Swithces," Lawrence Livermore Laboratory Report, UCID 18831, Livermore, California (Nov. 18, 1980).

Lassiter, et al., "High–Power Pulse Generation Using Semiconductors and Magnetic Cores," Paper 60–870, AIEE Summer General Meeting, Atlantic City, N.J., Jun. 19–24, 1960. No Month.

Melville, "The Use of Saturable Reactors as discharge devices for Pulse Generators," Paper No. 1034, Radio Section, pp.185–207 (1951) No Month.

Meidensha and Komatsu, "Solid–State Pulse Power Module for Excimer Laser," Proceedings of the Joint Conference on Electronic Devices and Semiconductor Power Conversion, Tokyo, Japan (Sep. 13, 1995).

Merritt and Dreifuerst, "Development and Operation of a Solid–State Switch for Thyratron Replacement," 8th IEEE International Pulsed Power Conference, San Diego, California (Jun. 1991).

*Primary Examiner*—Rodney B. Bovernick
*Assistant Examiner*—Robert E. Wise
*Attorney, Agent, or Firm*—Blakely, Sokoloff, Taylor & Zafman LLP

[57] ABSTRACT

A high voltage pulse power generating circuit capable of eliminating secondary pulses due to stage mismatch in the stages of its magnetic pulse compressor circuit is disclosed. The pulse generating circuit source comprises a high voltage charge storing element which is periodically discharged into a nonlinear magnetic compressor circuit. A mismatch correction circuit coupled to each stage of the compressor circuit discharges the reflected energy due to stage mismatch and thus eliminates the reflected energy from being launched back into the load. In a preferred embodiment, the pulse power generating circuit of the present invention utilizes a diode and a resistor that is coupled to each stage of the magnetic pulse compressor circuit. Various embodiments are disclosed.

46 Claims, 7 Drawing Sheets

U.S. PATENT DOCUMENTS

| | | |
|---|---|---|
| 5,138,622 | 8/1992 | Friede et al. . |
| 5,142,166 | 8/1992 | Birx . |
| 5,177,754 | 1/1993 | Ball et al. . |
| 5,235,608 | 8/1993 | Konishi . |
| 5,309,462 | 5/1994 | Taylor et al. . |
| 5,313,481 | 5/1994 | Cook et al. . |
| 5,315,611 | 5/1994 | Ball et al. . |
| 5,319,665 | 6/1994 | Birx . |
| 5,359,279 | 10/1994 | Gidon et al. . |
| 5,471,492 | 11/1995 | Pidgeon, Jr. et al. . |
| 5,514,918 | 5/1996 | Inatomi et al. . |

METHOD AND APPARATUS FOR ELIMINATING REFLECTED ENERGY DUE TO STAGE MISMATCH IN NONLINEAR MAGNETIC COMPRESSION MODULES

BACKGROUND OF THE INVENTION

1. Field of the Invention

The present invention relates generally to pulse power sources and more particularly, to an apparatus and method for eliminating secondary pulses due to stage mismatch in nonlinear magnetic compression pulse power sources for gas discharge lasers.

2. Description of the Prior Art

In applications where pulsed lasers are operated for extended periods of time, there is a need for energy efficiency, long term reliability and high component lifetimes. In these applications, magnetic compression circuits in conjunction with solid state switches have recently been utilized to supply pulse power because of the reliability and useful life of the magnetic compression circuits and solid state switches.

Such magnetic compression circuits generally utilize a multi-stage LC network to provide power compression. They are generally in accordance with U.S. Pat. No. 5,313,481.

One particular difficulty with using multiple stages of magnetic compression is the inability to perfectly match one stage to the next, so that complete energy transfer from one stage to the next cannot be accomplished. This problem is compounded when one or more stages are located in different thermal environments. The high temperature sensitivity of the capacitors typically used in these high voltage systems causes mismatch between stages as the temperature of each stage reaches a different value.

The mismatch between successive compression stages will cause some of the energy in the forward traveling pulse to be left behind at each compression stage. This energy is temporarily stored in the capacitors of each stage. Under certain conditions, this left-over energy can form a second electrical pulse which is launched toward the load some time after the main pulse. Such secondary pulses can, for example, cause damage to the electrodes in a gas discharge laser.

Figure 1:
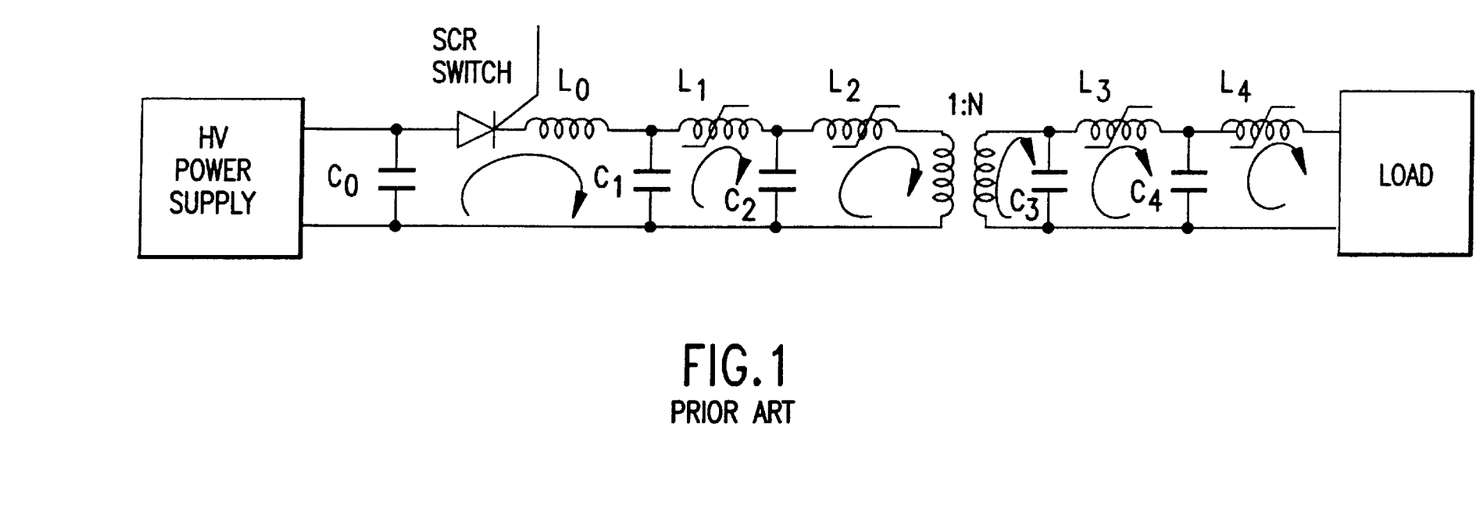
FIG. 1 illustrates a typical pulse power system which implements a magnetic pulse compression circuit with stages that exhibit a small mismatch.

FIG. 1 illustrates a typical pulse power system which implements a magnetic pulse compression circuit with stages that exhibit some small mismatch. In the system of FIG. 1, $C_0$, $L_0$, and $C_1$ form one C-L-C circuit while $C_1$, $L_1$ and $C_2$ form another C-L-C circuit. In the first C-L-C circuit, $C_0$ is the source capacitor, and in the second C-L-C circuit, $C_1$ is the source capacitor. During normal operation, a command charge power supply is used to charge the DC storage capacitor, $C_0$, to the desired voltage. Upon command, a semiconductor switch such as an Isolated Gate Bipolar Transistor (IGBT), or silicon controlled rectifier (SCR) switch will discharge $C_0$ (through $L_0$, which limits the peak current), into the capacitor $C_1$ at the input to the nonlinear magnetic pulse compression network. The nonlinear magnetic compression network provides temporal compression of the stored energy via the large inductance changes associated with the saturation of the nonlinear magnetic core material which is contained within the induction cores.

Once the compressed pulse reaches the load, such as a gas discharge laser, the mismatch between the load and the output stage leads to some reflected energy traveling backward through the compression stages. This reflected energy is captured on $C_0$ through the use of a semiconductor switch which will carry current in only one direction. This keeps the energy on $C_0$ from again traveling forward through the compression stages. In an ideal system, the capacitance values in each stage are accurately matched so that there is no overshoot or undershoot in the voltage of the source capacitor in a C-L-C circuit that is provided by an adjacent stage.

As mentioned above, the values of $C_0$, $C_1$, and $C_2$ do not remain at the same values as the temperature of each stage changes. When capacitive mismatch exists, the voltage on the source capacitor will not ring down to zero voltage upon the transfer of energy to an adjacent stage. If the source capacitor is slightly larger than desired, the voltage on the source capacitor will ring down to a non-zero positive value. If the source capacitor is slightly smaller than desired, the voltage will overshoot the zero voltage point and end up with a negative value.

This overshoot or undershoot voltage will occur for both the main pulse traveling toward the load and for the backward traveling reflected energy pulse. The voltage on the capacitor of a particular stage will create a potential across its neighboring inductor. Since each inductor, except for $L_0$, is a saturable inductor, the saturable inductors in the compressor circuit will eventually saturate in the direction necessary to allow energy transfer of the secondary pulse toward the load.

Figure 2:
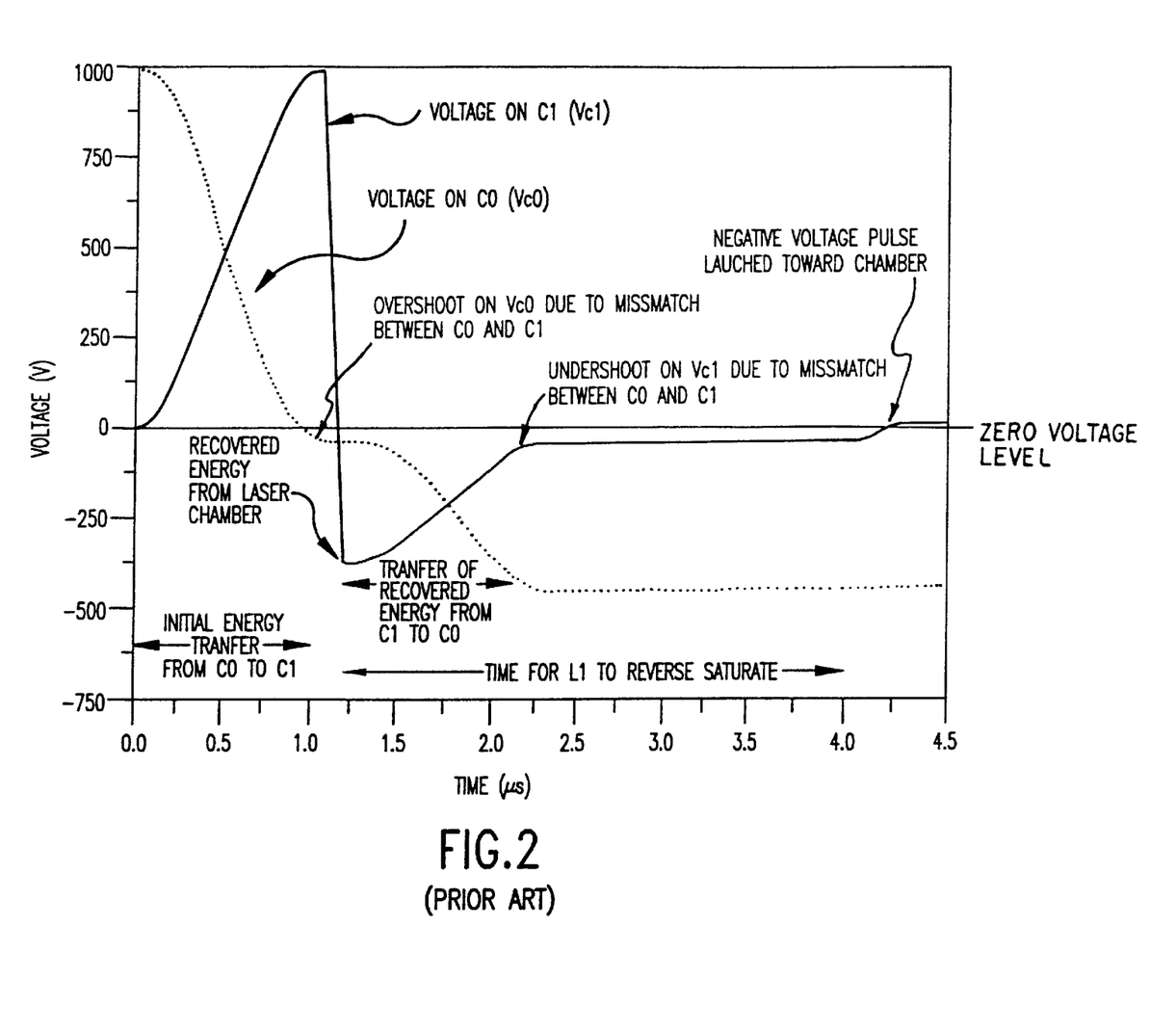
FIG. 2 is a graph illustrating the voltage on capacitors $C_0$ and $C_1$ of FIG. 1 as a function of time, when $C_0$ is slightly undersized relative to $C_1$.

FIG. 2 is a graph of the voltage on capacitors $C_0$ and $C_1$ as a function of time, when $C_0$ is slightly undersized relative to $C_1$. In this case, the voltage on $C_0$ will overshoot negatively during the initial energy transfer from $C_0$ to $C_1$. The reflected energy pulse travels from the load, back through the various stages, to $C_1$, and finally back to $C_0$. During the transfer of charge from $C_1$ back to $C_0$, the voltage on $C_1$ will undershoot the zero voltage point because its capacitance value is slightly larger than that of $C_0$. This results in leaving a negative voltage on $C_1$ since the reflected energy pulse is a negative voltage pulse.

This leftover negative voltage will remain on $C_1$ until $L_1$ saturates in the reverse conduction direction, either due to the potential difference between $C_1$ and $C_2$, or because of the bias current used to reset each saturable inductor to its proper point on the B-H curve in preparation for the next pulse. Once $L_1$ reverse saturates, a negative voltage pulse is launched toward the load which will be compressed by the remaining stages. In extreme cases, this pulse can have a magnitude of 1 to 2 kV compared to the main pulse peak of 15–20 kV. A pulse of such a magnitude can cause significant erosion to the electrodes in a gas discharge laser and result in lower electrode lifetimes.

Great care is taken to prepare the laser for the main 15–20 kV pulse. The gas medium has been cooled and homogenized, or in some cases replaced since the previous main discharge event. Just prior to the main discharge, care is taken to uniformly pre-ionize the medium. The end result is a discharge which initially will uniformly fill the discharge chamber. The plasma draws current from a large electrode area. Through processes such as carrier attachment, the discharge begins to localize into streamers over time periods measured in tens of nanoseconds. These processes are capable of reducing the discharge to a single localized arc in a few 100 nanoseconds. A few millijoules delivered into such a localized area can be more destructive than a few joules delivered to a uniform plasma which fills the discharge volume. Consequently, it is very important to minimize any energy pulses which might be delivered to the discharge other than at the desired main discharge time.

Accordingly, there is a need in the technology to provide an apparatus and method for eliminating reflected energy due to stage mismatch in pulse power lasers, so that electrode erosion may be minimized.

BRIEF SUMMARY OF THE INVENTION

A high voltage pulse power generating circuit capable of eliminating secondary pulses due to stage mismatch in the stages of its magnetic pulse compressor circuit is disclosed. The pulse generating circuit source comprises a high voltage charge storing element which is periodically discharged into a nonlinear magnetic compressor circuit. A mismatch correction circuit coupled to each stage of the compressor circuit discharges the reflected energy due to stage mismatch and thus eliminates the reflected energy from being launched back into the load. In a preferred embodiment, the pulse power generating circuit of the present invention utilizes a diode and a resistor that is coupled to each stage of the magnetic pulse compressor circuit. Various embodiments are disclosed.

DETAILED DESCRIPTION OF THE INVENTION

The present invention relates to a magnetic pulse compression circuit which is capable of eliminating reflected energy due to stage mismatch in pulse power lasers.

Figure 3:
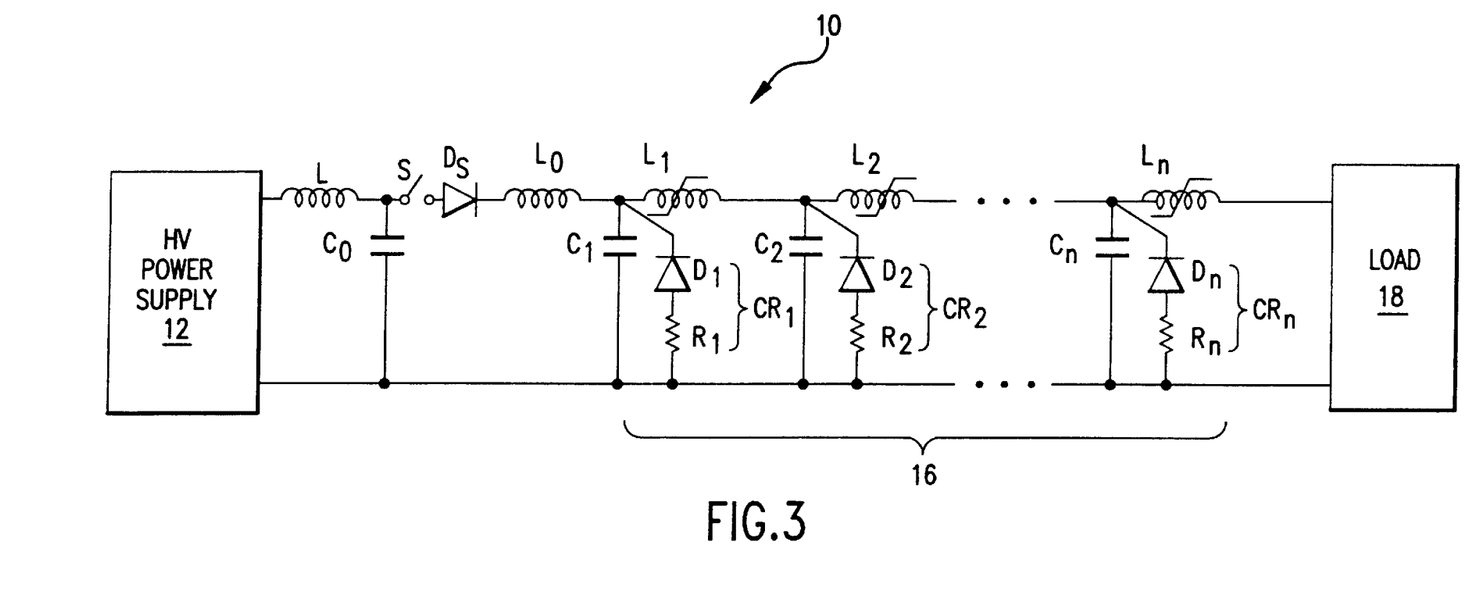
FIG. 3 is a schematic diagram of one embodiment of a magnetic pulse compression circuit which implements the mismatch correction circuit of the present invention.

FIG. 3 is a schematic diagram of one embodiment of a pulse power generating circuit 10 which implements the magnetic pulse compression circuit of the present invention. The pulse power generating circuit 10 comprises a high voltage DC power supply 12, an inductor L, a capacitor $C_0$, a solid state switch S, a second inductor $L_0$ and a pulse compressor circuit 16 for compressing the duration and increasing the peak power of pulses applied. The switch S may be a silicon controlled rectifier (SCR), an insulated-gate bipolar transistor (IGBT), a metal-oxide semiconductor field-effect transistor (MOSFET), a MOSFET controlled thyristor (MCT), or any other suitable switching element as known in the technology.

The pulse generating circuit 10 preferably comprises a diode $D_s$ connected in series with the switch S. The inclusion of $D_s$ in the circuit 10 ensures that the pulse compressor circuit 16 is nonconductive with respect to reverse current. In one preferred embodiment, the circuit 10 further comprises an inductor $L_0$ selected in conjunction with $C_1$ to provide a time constant for the LC combination to slightly slow the buildup of current flow through the switch S so that the switch may become completely closed prior to high current flow through the switch S. The pulse compressor circuit 16 is coupled to a load 18, typically a pulse discharge load such as an excimer laser.

The compressor circuit 16 comprises banks of capacitors $C_1, C_2, \ldots C_{n-1}$ and $C_n$ and one or more saturable core inductors $L_1, L_2, \ldots, L_n$ connected in a ladder network. As shown in FIG. 3, a first saturable core inductor $L_1$ is connected between $C_1$ and $C_2$, a second saturable core inductor $L_2$ may be connected in series between $C_2$ and $C_3$, ..., and a saturable core inductor $L_{n-1}$ is connected in series between $C_{n-1}$ and $C_n$. In the circuit 16 of FIG. 2, $C_0$, $L_0$ and $C_1$ form one C-L-C circuit while $C_1, L_1$ and $C_2$ form another C-L-C circuit. In the first C-L-C circuit, $C_0$ is the source capacitor, and in the second C-L-C circuit, $C_1$ is the source capacitor. This extends throughout the pulse compressor circuit 16, so that in essence, $C_{n-1}$, $L_{n-1}$ and $C_n$ forms the (n-1)th C-L-C circuit, with $C_{n-1}$ being the source capacitor.

The pulse compressor circuit 16 further comprises a plurality of mismatch correction circuits $CR_1, CR_2, \ldots, CR_n$ each comprising a high voltage diode and a resistor placed in parallel with $C_1, C_2, \ldots, C_n$ respectively. In particular, each mismatch correction circuit $CR_n$ comprises diode $D_n$ and resistor $R_n$ placed in parallel with $C_n$. The polarity of each of the diodes D1, D2, ..., Dn is chosen so that each diode acts as an open circuit to the positive voltage main pulse, and thus has no effect on the main pulse.

However, each diode $D_1, D_2, \ldots, D_n$ will conduct during the negative voltage swing caused by the reflected energy pulse. For example, when $D_1$ is conducting, $R_1$ discharges a negative voltage on $C_1$ at a rate determined by the RC time constant of $R_1$ and $C_1$. The value of each of the resistors $R_1$, $R_2, \ldots$, or $R_n$ is chosen to be small enough so that the corresponding voltage on capacitor $C_1, C_2, \ldots, C_n$, respectively, is substantially discharged after the main pulse and before the associated inductor $L_1, L_2, \ldots, L_n$, respectively, reverse saturates. However, the value of each resistor is also large enough to minimize the amount of charge discharged from the corresponding capacitor $C_1$, $C_2, \ldots, C_n$ respectively, during the passage of the negative voltage energy pulse reflected by the load (laser).

Figure 4:
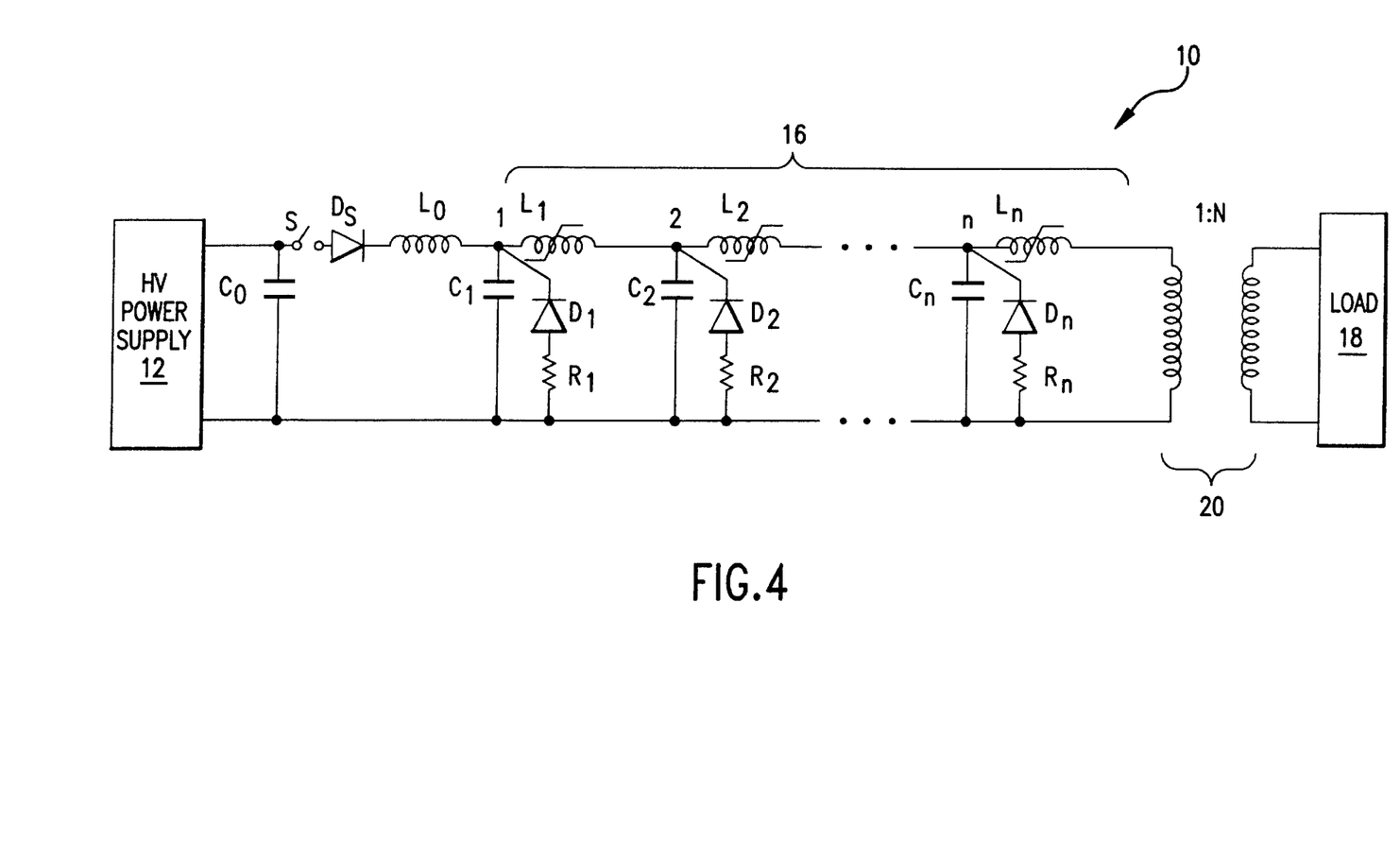
FIG. 4 is a schematic diagram of a second alternate embodiment of the magnetic pulse compression circuit of the present invention.
Figure 5:
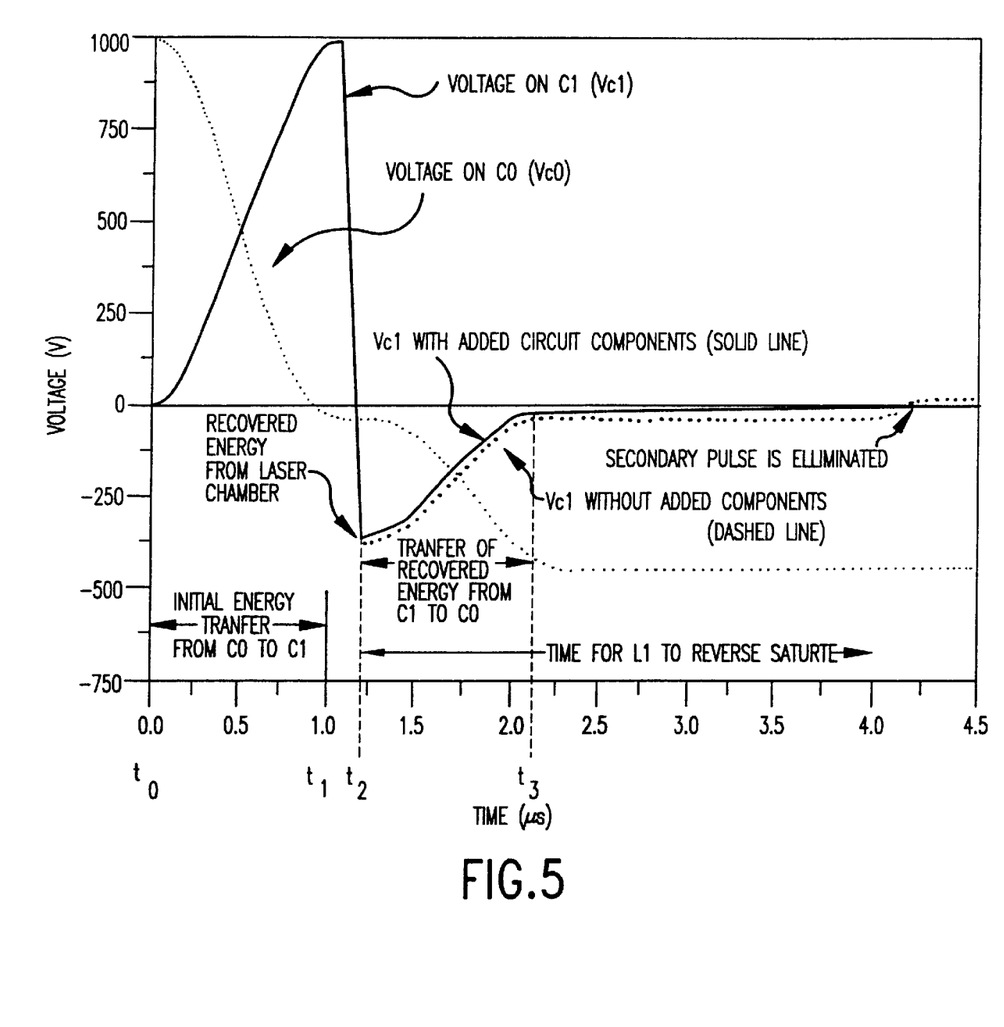
FIG. 5 is a graph illustrating the voltage on capacitors $C_0$ and $C_1$ of FIG. 3 or FIG. 5 as a function of time, when $C_0$ is slightly undersized relative to $C_1$.

FIG. 4 is a schematic diagram of a second alternate embodiment of the magnetic pulse compression circuit of the present invention. As shown in FIG. 5, a step up transformer 29 may be coupled to the output of the compression circuit 16. Alternatively the transformer 20 may be coupled to the pulse compressor circuit 16 of FIG. 3 at one of several nodes (for example, nodes 1, 2, ... n) depending on design requirements. A transformer 20 coupled to the circuit 10 at a node closer to the power supply 12 will subject downstream components of the pulse compressor circuit 16 to a higher voltage but lower current than the embodiment coupled to the output of the compression circuit 16, and of course will effect the design of such components because of the different impedance and other operating conditions they will be subjected to. Conversely, a transformer 20 coupled to the circuit 10 at a node closer to the load 18 will allow use of low voltage but high current components supplying the transformer. Furthermore, the transformer 20 itself can be somewhat different, depending on its placement, as stepping the voltage up to the desired high level before the final pulse compressor reduces the required peak current capabilities of the transformer 20.

As stated before, for the mismatch correction circuit CR to work properly under all conditions, the values of stage capacitance must be chosen so that the voltage remaining on each capacitor after the passage of the main pulse undershoots during the transmission of the negative voltage energy pulse reflected by the load. This is accomplished by intentionally nominally sizing C1 slightly larger than C0, C2 slightly larger than C1, etc., so that manufacturing tolerances and temperature variations will not be enough to cause any capacitor $C_n$ to actually be less than its preceding capacitor $C_{n-1}$. In this way, both the manufacturing tolerances and any temperature variations can be accommodated.

The circuit of FIG. 4 is identical to that of FIG. 3 with the exception of the addition of the step up transformer 20 shown between the output of the pulse power source and the load 18, for the preferred embodiment an excimer laser, though the step up transformer 20 may be inserted in circuit at $C_1$ or any of the capacitors between $C_1$ and $C_n$. The presence and location of the transformer 20 does not effect the function of the other components of the pulse power supply, though being an impedance transforming device (transforming voltages and currents), the values, current capacities and voltage capabilities of the components from and including the power supply 12 to the primary side of the transformer 20 will differ substantially from the corresponding components of FIG. 3, even though the same components will normally be chosen to have substantially the same time constants as the embodiment of FIG. 3.

The operation of the pulse power generating circuit 10 of the present invention will be described with reference to the embodiments of FIGS. 3 and 4 and the graph illustrated in FIG. 5. For discussion purposes, only one mismatch correction circuit $CR_1$ will be considered. It is understood however, that the use of other mismatch correction circuits in the other stages of the pulse compressor circuit 16 may be implemented. With the D.C. power supply 12 on prior to the time to (when switch S is open), capacitor $C_0$ is charged by the current supplied by the D.C. power supply 12. When fully charged, the voltage across capacitor $C_0$ is $V_{C0}$ (see FIG. 5). At $t_0$, the switch S closes, and the energy stored in capacitor $C_0$ is transferred to $C_1$ by action of the LC circuit comprising $L_0$, $C_0$ and $C_1$ with a time constant of approximately $$\left(\frac{L_0 C_0 C_1}{C_0 + C_1}\right)^{\frac{1}{2}},$$

$C_1$ becoming nearly fully charged and the current in inductor $L_0$ reducing substantially but still remaining positive at time $t_1$. Inductor $L_0$ is included in the circuit to purposely provide a sufficiently large time constant in this energy transfer to ensure that S is fully switched before high currents are encountered, and to limit the maximum current through the switch for a given energy transfer to a value manageable by a solid state switch by extending the time of the transfer. As capacitor $C_0$ starts to discharge through switch S and capacitor $C_1$ begins to charge during this transfer, the current in the coil of saturable inductor $L_1$ rapidly changes from a negative bias current to a low positive current, at which point the inductance jumps to a relatively high value to limit temporarily the rate of further current increase through $L_1$.

In addition, since the negative terminal of the diode $D_1$ is coupled to the positive terminal of $C_0$, $D_1$ acts as an open circuit to the positive voltage main pulse, and thus has no effect on the main pulse. However, due to the mismatch between $C_0$ and $C_1$, the voltage on $C_0$ will overshoot negatively during the energy transfer from $C_0$ to $C_1$.

At time $t_1$, while the current in inductor $L_0$ is low but still positive, the saturable core of inductor $L_1$ saturates, at which time the inductance of inductor $L_1$ jumps to a low value, allowing the current through $L_1$ to rise to a very high value to transfer the energy from capacitor $C_1$ to capacitor $C_2$ with a time constant approximately equal to $$\left(\frac{L_{1s} C_1 C_2}{C_1 + C_2}\right)^{\frac{1}{2}},$$

where $L_1$ is the inductance of the inductor $L_1$ with the core in saturation. Note that this time constant may be substantially shorter than the time constant $$\left(\frac{L_0 C_0 C_1}{C_0 + C_1}\right)^{\frac{1}{2}}$$

because may be made much less than $L_0$.

In the manner described above, energy is transferred through each stage of the compressor circuit 16. When $C_{n-1}$ is substantially fully charged and the core of inductor $L_{n-1}$ saturates, the energy is coupled through the saturated inductor from $C_{n-1}$ to $C_n$ in a short time period pulse, with the voltage across $C_n$ being applied to the laser 18.

When the voltage across $C_n$ builds to the level required to initiate discharge in the laser, the laser 18 fires. Energy stored in $C_n$ and still being fed to $C_n$ through the inductor is delivered to the laser discharge in the compressed time period of the pulse power supply 12. Once the compressed pulse reaches the load 18, the mismatch between the load 18 and the output stage of the pulse compressor circuit 16 leads to some reflected energy traveling backward through the compression stages of the pulse compressor circuit 16. The reflected energy has been recovered in $C_1$ at time $t_2$.

As the reflected energy is transferred from $C_1$ back to $C_0$ (between time $t_2$ and $t_3$), the voltage on $C_1$ will be negative as compared to ground and the diode $D_1$ will conduct, causing $R_1$ to discharge $C_1$ at a rate determined by the RC time constant of $R_1$ and $C_1$, effectively bringing the voltage of $C_1$ to near zero. The value of the resistor $R_1$ is selected to be small enough so that the corresponding capacitor $C_1$ is substantially discharged before the associated inductor $L_1$ reverse saturates. However, the value of R1 must be large enough to minimize the amount of charge discharged from the corresponding capacitor $C_1$ during the passage of the negative voltage reflected energy pulse.

As shown in FIG. 5, the voltage on $C_1$ (as shown with the solid line) is less when the mismatch correction circuit CR1 is added to the pulse compression circuit 16 (FIGS. 3 and 4), than when it is not implemented (as shown with the dashed line). By implementing the mismatch correction circuit of the present invention, the intentionally imposed undershoot voltage on $C_1$ due to mismatch between $C_0$ and $C_1$ is substantially discharged before inductor L1 reverse saturates. As a result, when the inductor L1 does reverse saturate, the negative voltage pulse that would have been launched toward the laser chamber is effectively eliminated.

As discussed earlier, the mismatch correction circuit CR may be applied to each stage of the pulse compression circuit 16 with properly chosen values of resistance in accordance with the size of each stage capacitor and the reverse saturation time of each stage inductor.

It has been observed that the embodiments of FIGS. 3 and 4 may be effectively used for pulse compression circuits operating in the 1 kV range using commonly available 1 kV high voltage diodes and resistors.

Figure 6:
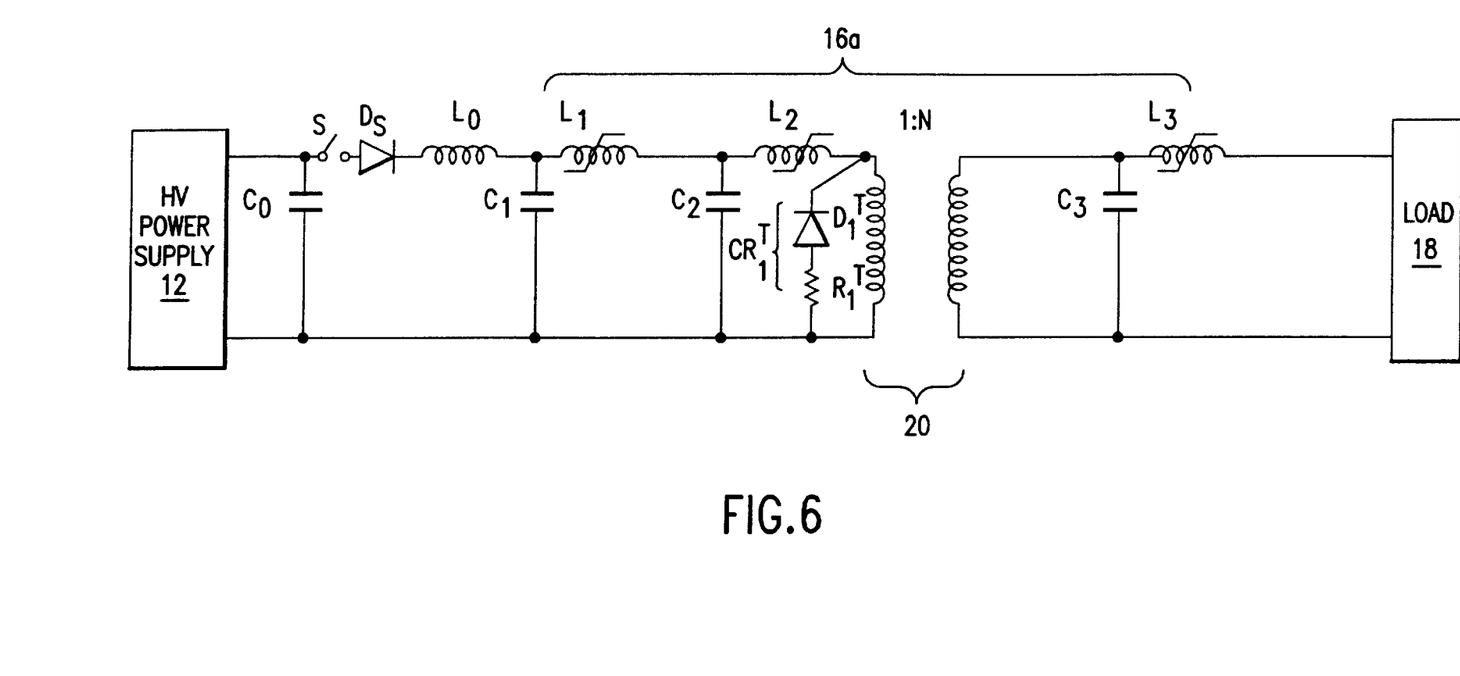
FIG. 6 is a schematic diagram of a third alternate embodiment of the magnetic pulse compression circuit of the present invention.

FIG. 6 is a schematic diagram of a third alternate embodiment of the magnetic pulse compression circuit of the present invention. This embodiment may be used in pulse compression circuits which operate in the 10–30 kV range or higher. Although the embodiments of FIGS. 3 and 4 may, theoretically be applied in pulse compression circuits operating in this range or higher, high voltage diodes that are commercially available are of unknown reliability, and series stacks of low voltage devices require additional components to ensure proper voltage division under both dc and transient conditions. The embodiment of FIG. 6 provides a simple alternative and solution to this problem. In this embodiment 16a of the pulse compression circuit, a diode $D_{1T}$ and resistor $R_{1T}$ are placed in parallel with the primary windings of the step-up transformer 20. In this manner, the charge on the high voltage capacitor, for example, C3, can be discharged using more robust 1 kV high voltage diodes instead of having to implement the high voltage diode stacks which have unknown reliability.

Figure 7:
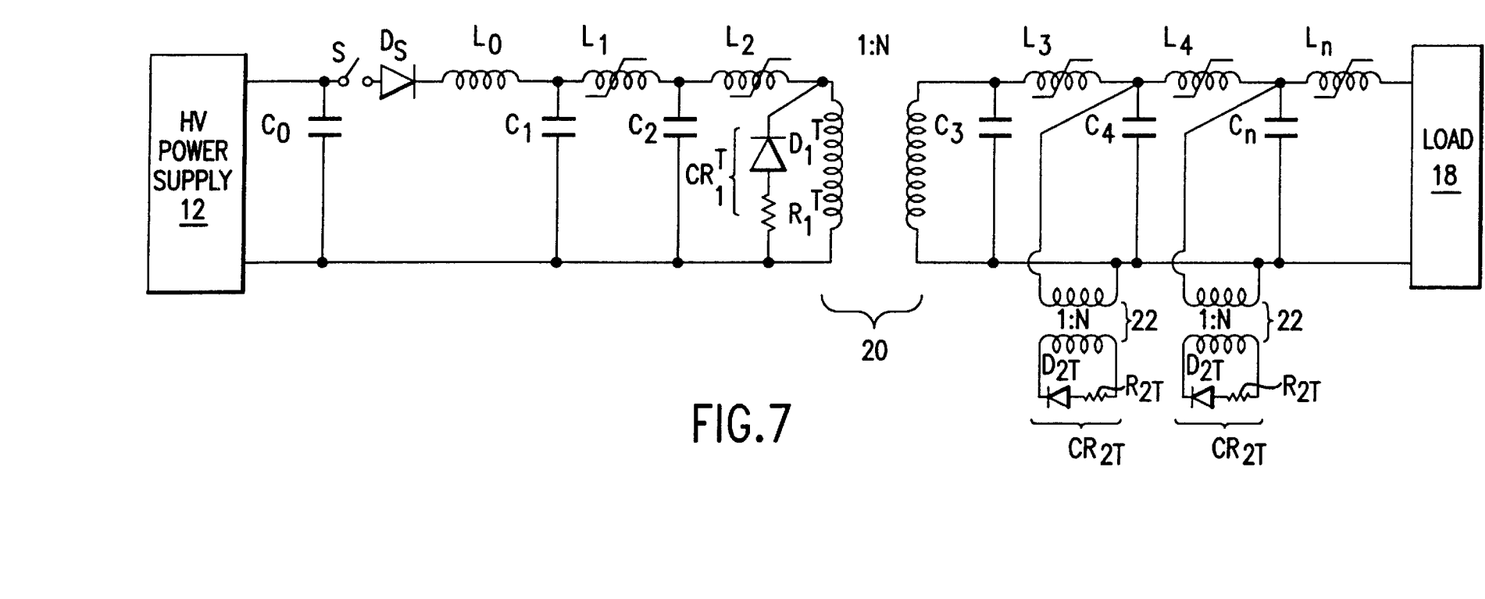
FIG. 7 is a schematic diagram of a fourth alternate embodiment of the magnetic pulse compression circuit of the present invention.

If additional compression stages exist after the step-up transformer 20, then a step-up transformer 22 may be placed across the high voltage capacitor (such as $C_4$ or $C_n$) of each stage with a 1 kV high voltage diode $D_{2T}$ and resistor $R_{2T}$ across the primary windings of the transformer 22. This embodiment is shown in FIG. 7.

By implementing the magnetic compression circuit of the present invention, reflected energy due to stage mismatch in pulse power lasers may be eliminated, so that electrode erosion is minimized.

The above-described embodiments of the present invention are especially suited to providing high voltage pulses for producing electrical discharges between the anode and the cathode of an excimer laser. The invention could also be applied to provide high voltage pulses in many other devices including lasers.

Although the invention has been described in terms of a certain preferred embodiment, other embodiments apparent to those skilled in the art are also within the scope of this invention. Accordingly, the scope of the invention is intended to be defined only by the claims which follow.

What is claimed is:

1. A pulse power generating circuit comprising:
    a capacitor for storing a charge;
    a magnetic pulse compressor circuit having a first stage and a second stage, said first stage comprising a first capacitor and a first saturable inductor, said second stage comprising a second capacitor and a second saturable inductor, said first capacitor having a capacitance value that is lesser than that of the second capacitor;
    a switch coupled at one end to said capacitor for storing a charge and coupled at another end to said first stage of said magnetic pulse compressor circuit for periodically applying the charge stored in said capacitor as an input to said compressor circuit, the compressor circuit providing an output pulse in response to the input, said compressor circuit also resonantly providing a reverse charge; and
    a mismatch correction circuit coupled in parallel with said capacitor in said magnetic pulse compressor circuit for discharging energy stored in the capacitor of the magnetic pulse compressor circuit due to stage mismatch, prior to providing of the reverse charge by the compressor circuit.

2. The circuit of claim 1, wherein said magnetic pulse compressor circuit comprises a third stage, comprising a third capacitor and a third saturable inductor, said second capacitor having a capacitance value that is lesser than that of the third capacitor.

3. The circuit of claim 1, further comprising a linear inductor, said linear inductor being coupled in series with said switch.

4. The circuit of claim 1, wherein the mismatch correction circuit comprises a diode and a resistor.

5. The circuit of claim 1, further comprising a diode coupled in series with said switch.

6. The circuit of claim 1, further comprising a power source, said power source providing said charge to said capacitor.

7. The circuit of claim 1, wherein said magnetic pulse compressor circuit is coupled to a load.

8. The circuit of claim 7, wherein said load is a laser.

9. The circuit of claim 8, wherein said laser is operable on a transverse discharge.

10. The circuit of claim 9, wherein said laser is an excimer laser.

11. The circuit of claim 8, further comprising a transformer, said transformer having a primary winding and a secondary winding, said primary winding being coupled to the output of said magnetic pulse compressor circuit and said secondary winding being coupled to said load.

12. The circuit of claim 1, wherein said magnetic pulse compressor circuit comprises a plurality of stages, each of said stages comprising a capacitor and a saturable inductor and an output capacitor coupled to the last stage of said plurality of stages.

13. The circuit of claim 12, further comprising a transformer, said transformer having a primary winding and a secondary winding, said primary winding being coupled to one of said stages and said secondary winding being coupled to a next stage.

14. A method of generating pulse power, comprising the steps of:
    storing a charge in a capacitor;
    periodically applying the charge stored as an input to a magnetic pulse compressor circuit having a plurality of stages, each of said stages having a capacitor and a saturable inductor;
    providing an output pulse in response to the input, said compressor circuit also resonantly providing a reverse charge; and
    discharging energy stored in said capacitor of said magnetic pulse compressor circuit due to stage mismatch, prior to providing the reverse charge.

15. The method of claim 14, wherein in said periodically applying step, said plurality of stages comprises a first stage and a second stage, said first stage having a first capacitor and a first saturable inductor, said second stage having a second capacitor and a second saturable inductor, said first capacitor having a capacitance value that is lesser than that of the second capacitor.

16. The method of claim 14, wherein said periodically applying step is conducted by means of a switch.

17. The method of claim 16, further comprising a linear inductor, said linear inductor being coupled to said switch.

18. The method of claim 14, wherein in said storing step, said capacitor is coupled to a second capacitor.

19. The method of claim 14, wherein in said discharging step comprises the step of coupling a mismatch correction circuit in parallel with said capacitor of said magnetic pulse compressor circuit, wherein said mismatch correction circuit comprises a diode and a resistor, said mismatch correction circuit discharging energy stored in said capacitor of said magnetic pulse compressor circuit due to stage mismatch, prior to providing the reverse charge.

20. The method of claim 14, further comprising the step of providing a power source for providing said charge to said capacitor.

21. The method of claim 14, further comprising the step of providing said output pulse to a load coupled to said magnetic pulse compressor circuit.

22. The method of claim 21, wherein said load is a laser.

23. The method of claim 22, further comprising the step of providing said output pulse to a transformer, said transformer having a primary winding and a secondary winding, said primary winding being coupled to the output of said magnetic pulse compressor circuit and said secondary winding being coupled to said load.

24. The method of claim 14, wherein said magnetic pulse compressor circuit further comprises a plurality of stages, each of said stages comprising a capacitor and a saturable inductor and an output capacitor in parallel with the last stage of said plurality of stages.

25. The method of claim 24, further comprising a transformer, said transformer having a primary winding and a secondary winding, said primary winding being coupled to one of said stages and said secondary winding being coupled to a next stage.

26. A high-voltage pulse power laser system, comprising:
 a power source for supplying a charge;
 a capacitor for storing said charge;
 a magnetic pulse compressor circuit;
 a solid state switch for periodically applying the charge stored in said capacitor as an input to said compressor circuit, the compressor circuit providing an output pulse in response to the input, said compressor circuit also resonantly providing a reverse charge, said compressor circuit having at least one stage that comprises a capacitor and a saturable inductor;
 a laser coupled to said magnetic pulse compressor circuit, said laser receiving said output pulse; and
 a mismatch correction circuit coupled in parallel with said capacitor of said compressor circuit for discharging energy stored in said capacitor of said compressor circuit due to stage mismatch, prior to providing of the reverse charge by the compressor circuit.

27. The system of claim 26, further comprising a diode coupled in series with said switch.

28. The system of claim 26, wherein said magnetic pulse compressor circuit comprises a first stage having a first capacitor and a first saturable inductor and a second stage having a second capacitor and a second saturable inductor, said capacitor having a capacitance value that is lesser than that of the second capacitor, said first stage being coupled to said switch.

29. The system of claim 26, further comprising a linear inductor, said linear inductor being coupled in series with said switch.

30. The system of claim 26, further comprising a second capacitor coupled to said capacitor for storing a charge.

31. The system of claim 26, wherein said mismatch correction circuit comprises a resistor and a diode.

32. The system of claim 26, further comprising a power source, said power source providing said charge to said capacitor.

33. The system of claim 26, further comprising a transformer, said transformer having a primary winding and a secondary winding, said primary winding being coupled to the output of said magnetic pulse compressor circuit and said secondary winding being coupled to said laser.

34. The system of claim 26, wherein said magnetic pulse compressor circuit comprises a plurality of stages, each of said stages comprising a capacitor and a saturable inductor and an output capacitor coupled to the last stage of said plurality of stages.

35. The system of claim 34, further comprising a transformer, said transformer having a primary winding and a secondary winding, said primary winding being coupled to one of said stages and said secondary winding being coupled to a next stage.

36. A method of discharging energy in at least one stage in a magnetic pulse compressor circuit in a laser system, comprising the steps of:
 periodically applying a charge stored as an input to a magnetic pulse compressor circuit having a plurality of stages, each stage having a capacitor and a saturable inductor;
 providing an output pulse in response to the input, said compressor circuit also resonantly providing a reverse charge; and
 discharging energy stored in said capacitor of said magnetic pulse compressor circuit due to stage mismatch, prior to providing the reverse charge.

37. The method of claim 36, wherein in said periodically applying step, said plurality of stages comprises a first stage and a second stage, said first stage having a first capacitor and a first saturable inductor, said second stage having a second capacitor and a second saturable inductor, said first capacitor having a capacitance value that is lesser than that of the second capacitor.

38. The method of claim 36, wherein said periodically applying step is applied by means of a solid state switch.

39. The method of claim 38, further comprising a linear inductor, said linear inductor being coupled to said switch.

40. The method of claim 36, further comprising the step of storing said charge in a capacitor prior to said periodically applying step.

41. The method of claim 36, wherein in said discharging step comprises the step of coupling a mismatch correction circuit in parallel with said capacitor of said magnetic pulse compressor circuit, wherein said mismatch correction circuit comprises a diode and a resistor, said mismatch correction circuit discharging energy stored in said capacitor of said magnetic pulse compressor circuit due to stage mismatch, prior to providing the reverse charge.

42. The method of claim 36, further comprising the step of providing a power source for providing said charge.

43. The method of claim 36, further comprising the step of providing said output pulse to a transformer, said transformer having a primary winding and a secondary winding, said primary winding being coupled to the output of said pulse compressor circuit and said secondary winding being coupled to said load.

44. The method of claim 36, wherein said pulse compressor circuit comprises a plurality of stages, each of said stages comprising a capacitor and a saturable inductor and an output capacitor in parallel with the last stage of said plurality of stages.

45. The method of claim 44, further comprising a transformer, said transformer having a primary winding and a secondary winding, said primary winding being coupled to one of said stages and said secondary winding being coupled to a next stage.

46. An excimer laser comprising:

a laser chamber;

an anode and a cathode disposed in said laser chamber;

a pulse power generating circuit for providing high voltage pulses for generating electrical discharges between said anode and said cathode said pulse power generating circuit comprising:

a capacitor for storing a charge;

a magnetic pulse compressor circuit having a first stage and a second stage, said first stage comprising a first capacitor and a first saturable inductor, said second stage comprising a second capacitor and a second saturable inductor, said first capacitor having a capacitance value that is lesser than that of the second capacitor;

a switch coupled at one end to said capacitor for storing a charge and coupled at another end to said first stage of said magnetic pulse compressor circuit for periodically applying the charge stored in said capacitor as an input to said compressor circuit, the compressor circuit providing an output pulse in response to the input, said compressor circuit also resonantly providing a reverse charge; and     a mismatch correction circuit coupled in parallel with said capacitor in said magnetic pulse compressor circuit for discharging energy stored in the capacitor of the magnetic pulse compressor circuit due to stage mismatch, prior to providing of the reverse charge by the compressor circuit.

\* \* \* \* \*

UNITED STATES PATENT AND TRADEMARK OFFICE
CERTIFICATE OF CORRECTION

PATENT NO. : 5,914,974
DATED : June 22, 1999
INVENTOR(S) : Partlo, et al.

It is certified that error appears in the above-identified patent and that said Letters Patent is hereby corrected as shown below:

Column 6, line 16 delete "$L_1$ and insert -- $L_{1S}$

Column 6, line 24, after "because" insert -- $L_{1S}$

Signed and Sealed this

Twenty-eighth Day of December, 1999

Attest:

Q. TODD DICKINSON

Attesting Officer

Acting Commissioner of Patents and Trademarks